United States Patent
Hsu et al.

(10) Patent No.: US 8,354,315 B2
(45) Date of Patent: Jan. 15, 2013

(54) FABRICATION METHOD OF A POWER SEMICONDUTOR STRUCTURE WITH SCHOTTKY DIODE

(75) Inventors: Hsiu Wen Hsu, Hsinchu County (TW); Chun Ying Yeh, Hsinchu (TW)

(73) Assignee: Great Power Semiconductor Corp., Taipei County (TW)

( * ) Notice: Subject to any disclaimer, the term of this patent is extended or adjusted under 35 U.S.C. 154(b) by 295 days.

(21) Appl. No.: 12/821,501

(22) Filed: Jun. 23, 2010

(65) Prior Publication Data

US 2011/0316077 A1 Dec. 29, 2011

(51) Int. Cl.
*H01L 21/8234* (2006.01)
(52) U.S. Cl. .......... 438/237; 438/259; 257/334
(58) Field of Classification Search .......... 438/237, 438/259; 257/334, E21.616
See application file for complete search history.

(56) References Cited

U.S. PATENT DOCUMENTS

| | | | |
|---|---|---|---|
| 2008/0206944 A1* | 8/2008 | Chuang et al. | 438/237 |
| 2009/0159989 A1* | 6/2009 | Hong | 257/408 |
| 2010/0264488 A1* | 10/2010 | Hsieh | 257/334 |
| 2011/0121386 A1* | 5/2011 | Hsieh | 257/334 |

* cited by examiner

*Primary Examiner* — Phuc Dang
(74) *Attorney, Agent, or Firm* — Rosenberg, Klein & Lee

(57) ABSTRACT

A power semiconductor structure with schottky diode is provided. In the step of forming the gate structure, a separated first polysilicon structure is also formed on the silicon substrate. Then, the silicon substrate is implanted with dopants by using the first polysilicon structure as a mask to form a body and a source region. Afterward, a dielectric layer is deposited on the silicon substrate and an open penetrating the dielectric layer and the first polysilicon structure is formed so as to expose the source region and the drain region below the body. The depth of the open is smaller than the greatest depth of the body. Then, a metal layer is filled into the open to electrically connect to the source region and the drain region.

8 Claims, 7 Drawing Sheets

FABRICATION METHOD OF A POWER SEMICONDUTOR STRUCTURE WITH SCHOTTKY DIODE

BACKGROUND OF THE INVENTION (1) Field of the Invention

The present invention relates to a trenched power semiconductor structure and a fabrication method thereof, and more particularly relates to a trenched power semiconductor structure with schottky diode and a fabrication method thereof.

(2) Description of the Prior Art

In present, the trend in development for trenched power semiconductor devices turns toward the performance of switching speed. The increasing of switching speed is especially helpful for reducing switching loss in high-frequency applications. Among various solutions for improving switching speed, it is an effective method to add a schottky diode in the power semiconductor structure.

FIG. 1 is a circuit diagram showing a metal-oxide-semiconductor (MOS) transistor T1 with a schottky diode SD1 to improve switching loss. As shown, the MOS transistor T1 has a body diode D1 connected to the schottky diode SD1 in parallel. Because the turn-on voltage of the schottky diode SD1 is smaller than that of the body diode D1, the current would be directed from the source electrode S through the schottky diode SD1 to the drain electrode D when the MOS transistor T1 becomes forwardly biased, and the body diode D1 would not be conducted.

Because of the minority carriers, the switching of the body diode D1 is quite slow, which may cause unwanted time delay to result in additional switching loss. The usage of schottky diode with no minority carrier, is able to improve the problems of time delay and switching loss when the body diode D1 is conducted.

SUMMARY OF THE INVENTION

Accordingly, it is a main object of the present invention to provide a method to manufacture a trenched power transistor with a parallel-connected schottky diode simultaneously by using the well known semiconductor fabrication technologies.

To achieve the above mentioned object, a fabrication method of a power semiconductor structure with schottky diode is provided. Firstly, a polysilicon layer, which includes at least a polysilicon gate structure and a first polysilicon structure spaced with a predetermined distance, is formed on a silicon substrate. Next, at least a body and at least a source region are formed in the silicon substrate by implanting dopants through the first polysilicon structure. The body is located between the polysilicon gate structure and the first polysilicon structure, and the source region is located in the body. Thereafter, a dielectric layer is formed to cover the polysilicon gate structure and the first polysilicon structure. Then, an open, which is substantially aligned to the first polysilicon structure, is formed in the dielectric layer to expose the silicon substrate below the body. The open at least penetrates the dielectric layer and has a depth smaller than a greatest depth of the body. Thereafter, a metal layer is filled in the open.

Based on the above mentioned fabrication method, a power semiconductor structure with schottky diode is provided in the present invention. The power semiconductor structure has a silicon substrate, at least a polysilicon gate structure, a first polysilicon structure, at least a body, at least a source region, a dielectric layer, and a metal layer. The polysilicon gate structure and the first polysilicon structure are located on the silicon substrate and separated by a predetermined distance. The body is located in the silicon substrate between the polysilicon gate structure and the first polysilicon structure, and is partially shielded by the first polysilicon structure. The source region is located in the body and is also partially shielded by the first polysilicon structure. The dielectric layer covers the polysilicon gate structure and the first polysilicon structure and has an open extending to the silicon substrate below the body. The source region is adjacent to the open, and the depth of the open is smaller than a greatest depth of the body. The metal layer is located on the dielectric layer and filled into the open.

BRIEF DESCRIPTION OF THE DRAWINGS

The present invention will now be specified with reference to its preferred embodiment illustrated in the drawings, in which.

DESCRIPTION OF THE PREFERRED EMBODIMENT

It is a main feature of the present invention to adapt the fabrication step of the polysilicon gate to form a first polysilicon structure on the silicon substrate, and to define the body and the source region in a range between the first polysilicon structure and the polysilicon gate. The dielectric structure deposited thereon is etched to form an open penetrating the first polysilicon structure to expose the source region and the drain region below the body. Thus, the metal layer filled into the open can be electrically connected to the source region and the drain region simultaneously so as to form a schottky diode parallel connected with the power transistor.

Figure 1:
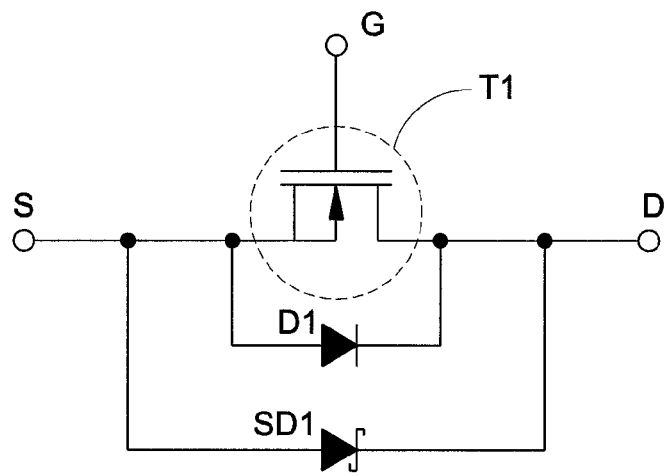
FIG. 1 is a circuit diagram showing a MOS transistor with a schottky diode to improve switching loss.
Figure 2A:
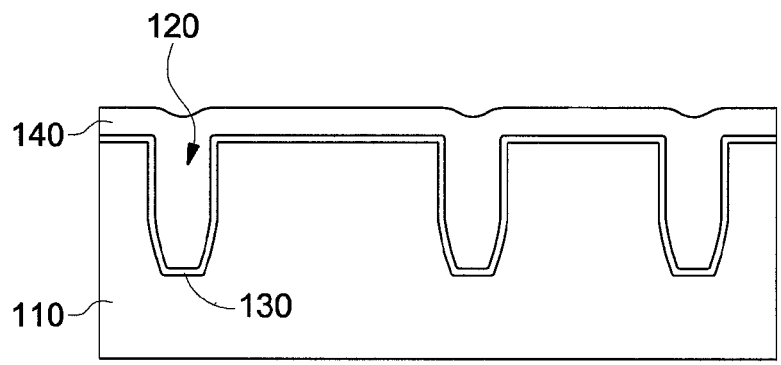
FIGS. 2A to 2E are schematic views showing a fabrication of the power semiconductor structure with schottky diode in accordance with a first embodiment of the present invention.

FIGS. 2A to 2E are schematic views showing a fabrication method of a trenched power semiconductor structure with schottky diode in accordance with a first embodiment of the present invention. As shown in FIG. 2A, firstly, at least a gate trench 120 is formed in a silicon substrate 110. Then, a gate dielectric layer 130 is formed to cover at least the inner surface of the gate trench 120. Thereafter, a polysilicon layer 140 is deposited on the exposed surfaces of the silicon substrate 110 and fills the gate trenches 120.

Figure 2B:
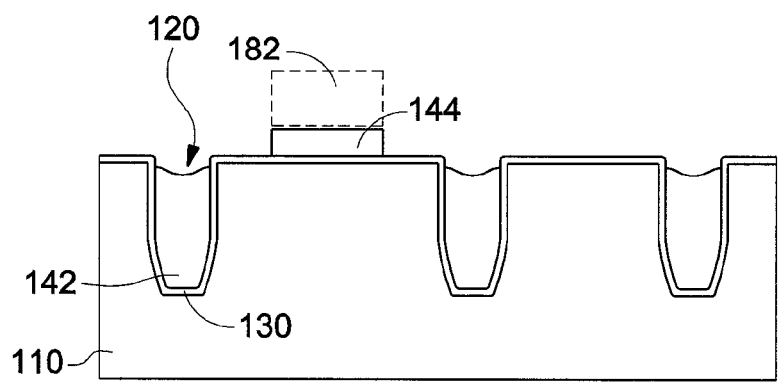

Next, as shown in FIG. 2B, the unwanted portion of the polysilicon layer 140 is removed by etching to leave at least a gate polysilicon structure 142 located in the gate trench 120 and at least a first polysilicon structure 144 on the upper surface of the silicon substrate 110. A predetermined distance is kept between the first polysilicon structure 144 and the polysilicon gate structure 142. The first polysilicon structure 144 is utilized to define the range of the body and the source region of the cells.

In the present embodiment, a pattern layer 182 is formed on the polysilicon layer 140 to define the location of the first polysilicon structure 144, and the exposed polysilicon layer 140 outside the gate trench 120 is removed by etching back so as to form the polysilicon gate structure 142 and the first polysilicon structure 144 in an etching step. However, the present invention is not so restricted. The pattern layer 182 for defining the first polysilicon structure 144 may be adapted to define the range of the polysilicon gate structure 142 also, and the polysilicon gate structure 142 may not be totally located in the gate trench 120.

Figure 2C:
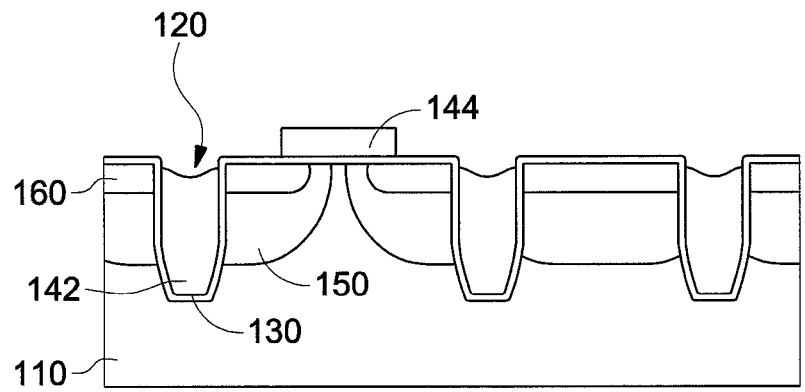

Thereafter, as shown in FIG. 2C, by using the first polysilicon structure 144 as a mask, an ion implantation step is carried out to implant dopants of first conductive type into the silicon substrate 110 such that at least a body 150 is formed between the polysilicon gate structure 142 and the first polysilicon structure 144. The depth profile of the body 150 is gradually declined from the sidewall of the gate trench 120 toward the first polysilicon structure 144 and a portion of the body 150 is located right below the first polysilicon structure 144. That is, the body 150 is partially shielded by the first polysilicon structure 144. It is also noted that, in accordance with the present embodiment, two isolated bodies 150 are formed corresponding to the both sides of the first polysilicon structure 144.

Next, by using the first polysilicon structure 144 as the implanting mask, another ion implantation step is carried out to implant dopants of second conductive type to the silicon substrate 110 such that at least a source region 160 is formed in the body 150. In addition, a portion of the source region 160 is also located right below the first polysilicon structure 144. The above mentioned first conductive type and second conductive type may be P-type and N-type respectively. But the present invention is not so restricted. The first conductive type and the second conductive type may be N-type and P-type also. As mentioned above, although the body 150 and the source region 160 are both defined by using the first polysilicon structure 144, the range of the source region 160 can be limited in the body 150 by adequately adjusting the parameters of the implanting process and the following drive-in process.

Figure 2D:
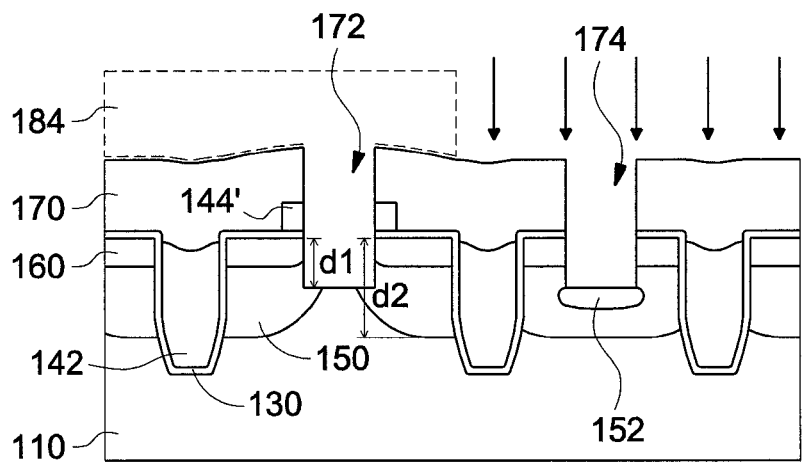

Next, as shown in FIG. 2D, a dielectric layer 170 is formed to cover the polysilicon gate structure 142, the first polysilicon structure 144, and the exposed surfaces of the silicon substrate 110. Thereafter, an open 172 is formed in the dielectric layer 170 by etching. The open 172 is substantially aligned to the first polysilicon structure 144 and penetrates at least the dielectric layer 170 and the first polysilicon structure 144 to expose the source region 160 therebelow. Because the width of the first polysilicon structure 144 is greater than that of the open 172, a portion of the first polysilicon structure 144' is remained on the sidewall of the open 172. In addition, in the present embodiment, the bottom of the open 172 is located in the silicon substrate 110 below the body 150, which can be regarded as the drain region. Although the bottom of the open 172 should be located below the body 150, the depth d1 of the open 172 can be smaller than the greatest depth d2 of the body 150 because of the depth profile of the body 150, which shows that the depth of the body 150 right below the first polysilicon structure 144 is much smaller than the body 150 adjacent to the gate trench 120.

Figure 2E:
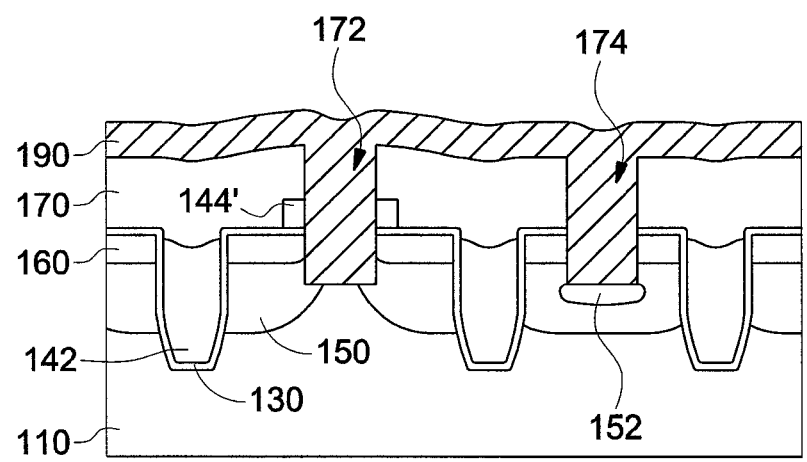

Also referring to FIG. 2D, when the open is formed in the dielectric layer 170, a contact window 174 for exposing the body 150 is also formed in the dielectric layer 170. The open 172 is then shielded by a pattern layer 184 and an ion implantation step is carried out to selectively implant dopants of first conductive type into the contact window 174 to form a heavily doped region 152 at the bottom of the contact window 174. Finally, as shown in FIG. 2E, a metal layer 190 is deposited on the dielectric layer 170 and also fills the open 172 and the contact window 174. The metal layer 190 in the contact window 174 is electrically connected to the body through the heavily doped region 152, and a schottky diode is formed at the interface between the metal layer 190 in the open 172 and the silicon substrate 110.

As mentioned above, the fabrication process of the schottky diode parallel connected to the trenched power transistor can be integrated in the fabrication processes for forming the trenched power transistor as indicated in the right side of FIGS. 2A to 2E. Thus, the fabrication method can be effectively simplified and the fabrication cost can be reduced.

Figure 3A:
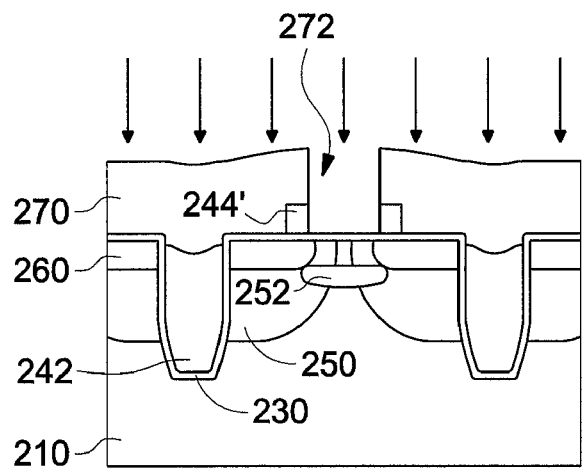
FIGS. 3A to 3B are schematic views showing a fabrication of the power semiconductor structure with schottky diode in accordance with a second embodiment of the present invention.
Figure 3B:
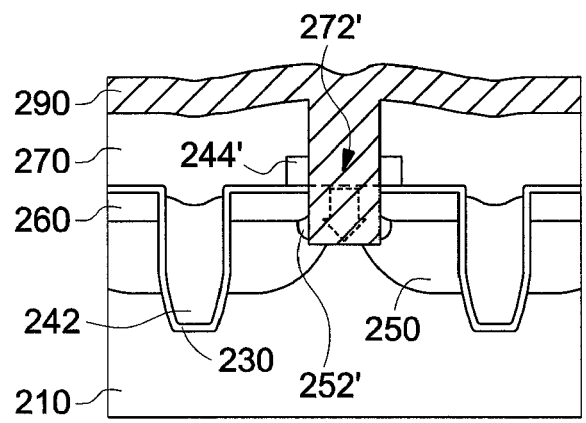

FIGS. 3A and 3B are schematic views showing a power semiconductor structure with schottky diode in accordance with a second embodiment of the present invention. In contrast with the first embodiment, which shows an open 172 and a contact window 174 in the dielectric layer 170, only the open 272 is formed in the dielectric layer 270 according to the present embodiment. The open 272, which is utilized for the formation of the schottky diode, is also utilized for electrically connecting the metal layer 290 and the body 250.

Referring to FIG. 3A, which shows the fabrication step following the step of FIG. 2C, an open 272 is formed to penetrate the dielectric layer 270 and the first polysilicon structure 244' after the dielectric layer 272 is deposited on the polysilicon gate structure 242, the first polysilicon structure 244 and the exposed surface of the silicon substrate 210. The width of the open 272 is smaller than the width of the first polysilicon structure 244' before etched. Thus, after the etching process, the open 272 is formed with a portion of the first polysilicon structure 244' left on both sides of the open 272.

Next, by using the etched dielectric layer 270 as a mask, a heavily doped region 252 is formed in the silicon substrate 210 by selectively implanting dopants of first conductive type into the open 272. Because the width of the open 272 is smaller than that of the first polysilicon structure 244, the influence for the implantation step performed by using the etched dielectric layer 270 to the source region 260 can be minimized. The depth of the heavily doped region 252 can be controlled by adjusting implanting power such that the heavily doped region 252 is substantially located below the source region 260 and has at least a portion located in the body 250. Thereafter, as shown in FIG. 3B, the depth of the open 272 is extended by etching as indicated by the dashed line, such that the resulted open 272' has a bottom located below the source region 260 and the heavily doped region 252. Afterward, a metal layer 270 is deposited over the whole surface of the dielectric layer 270 and fills the open 272'.

It is noted that, in the present embodiment, the width of the heavily doped region 252 is greater than that of the open 272.

Thus, a portion of the heavily doped region 252' is remained on the sidewall of the open 272' after the etching process for extending the depth of the open 272 as shown in FIG. 3B is performed. The metal layer 290 filled into the open 272' can be electrically connected to the body 250 through the remained heavily doped region 252' and a schottky diode is formed at the bottom of the open 272'.

Figure 4:
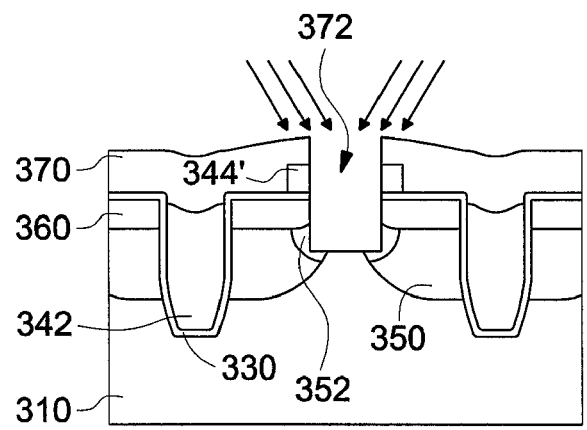
FIG. 4 is a schematic view showing a fabrication of the power semiconductor structure with schottky diode in accordance with a third embodiment of the present invention.

FIG. 4 is a schematic view showing a fabrication of the power semiconductor structure with schottky diode in accordance with a third embodiment of the present invention. Referring to FIG. 4, which shows the fabrication process following the step of FIG. 2C, an open 372 is formed in the dielectric layer 370 by etching after the dielectric layer 370 is deposited on the polysilicon gate structure 342, the first polysilicon structure 344, and the exposed surface of the silicon substrate 310. The open 372 penetrates the dielectric layer 370 and the first polysilicon structure 344' and reaches the location below the source region 360. In addition, the bottom of the open 372 is located in the silicon substrate 310 below the body 350, which can be regarded as the drain region. Then, a tilted ion implantation step is carried out to implant dopants with first conductive type to the body 350 below the source region 360 such that at least a heavily doped region 352 is formed adjacent to the sidewall and the bottom of the open 372.

Figure 5A:
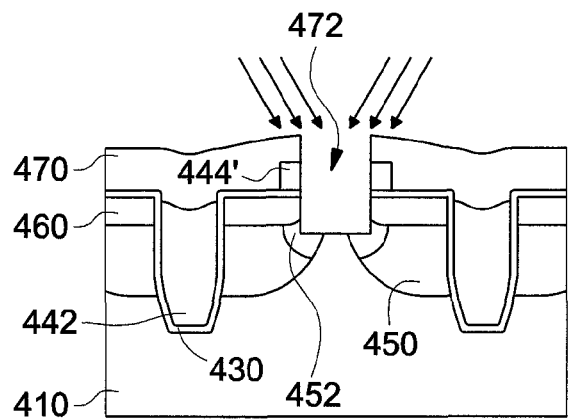
FIGS. 5A to 5B are schematic views showing a fabrication of the power semiconductor structure with schottky diode in accordance with a fourth embodiment of the present invention.
Figure 5B:
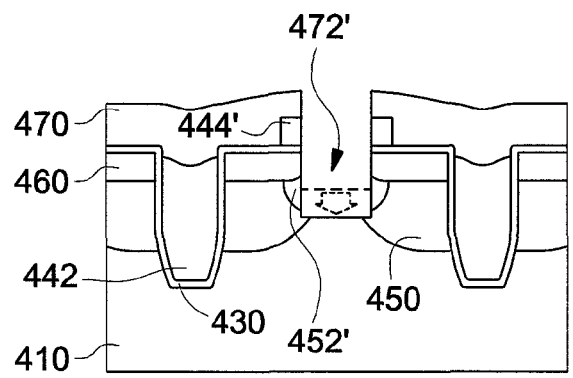

FIGS. 5A and 5B are schematic views showing a fabrication method of the power semiconductor structure with schottky diode in accordance with a fourth embodiment of the present invention. The fabrication process as shown in FIG. 5A is substantially identical to that of FIG. 4, but the fabrication process as shown in FIG. 5B indicates that after the heavily doped region 452 is formed in the body 450, the open 472 is extended downward by using the dielectric layer 470 as an etching mask. The resulted open 472' reaches the location below the heavily doped region 452, which is indicated by the dashed arrow. As shown, the portion of the heavily doped region 452 at the bottom of the open 472 is totally removed with the portion 452' adjacent to the sidewall of the open 472 remained.

Figure 6A:
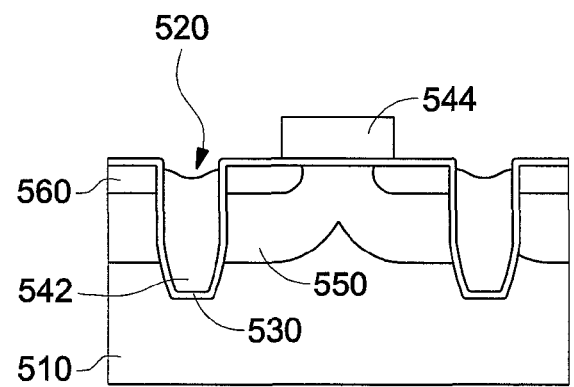
FIGS. 6A to 6E are schematic views showing a fabrication of the power semiconductor structure with schottky diode in accordance with a fifth embodiment of the present invention.

FIGS. 6A to 6E are schematic views showing a fabrication method of the power semiconductor structure with schottky diode in accordance with a fifth embodiment of the present invention. FIG. 6A shows the fabrication step following the step of FIG. 2B. As shown, the first polysilicon structure 544 is utilized as an implanting mask to selectively implant dopants of first conductive type into the silicon substrate 510. In contrast with the embodiment as shown in FIG. 2C, which features two separated bodies 150 located at the both sides of the first polysilicon structure 144, there is only an integrated body 550 located below the first polysilicon structure 544 as shown in FIG. 6A. With the parameters of the ion implantation process and the following drive-in process being adequately adjusted, the integrated body 550 can be formed in the silicon substrate 510. Identical to that of the separated bodies 150, the depth profile of the body 550 declines from the sidewall of the gate trench 520 toward the first polysilicon structure 544. Afterward, another ion implantation process is carried out to implant dopants of second conductive type into the body 550 such that two source regions 560 are formed at both sides of the first polysilicon structure 544. Although the integrated body 550 is shown in the present embodiment, the present embodiment is not so restricted. There may be two separated bodies located below the first polysilicon structure 544 also.

Figure 6B:
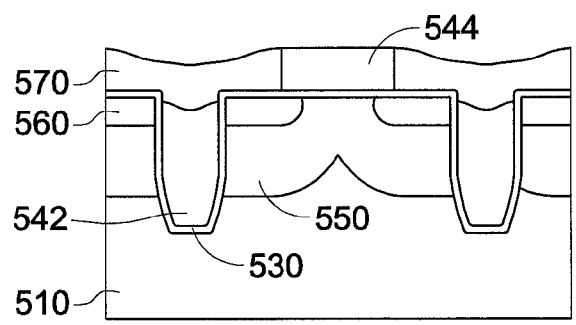
Figure 6C:
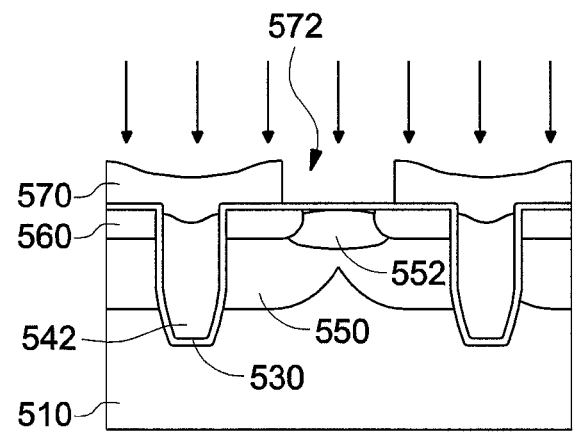

Next, as shown in FIG. 6B, a dielectric layer (not shown) is deposited over all the exposed surfaces and an etching back process is carried out to expose the upper surface of the first polysilicon structure 544. It is noted that the resulted dielectric structure 570 not only covers the polysilicon structure 542 within the gate trench 520 but also covers the upper surface of the silicon substrate 510. Thereafter, as shown in FIG. 6C, the exposed first polysilicon structure 544 is removed to form an open 572 in the dielectric structure 570, which exposes the silicon substrate 510. Then, a heavily doped region 552 is formed in the body 550 by implanting dopants of first conductive type through the open 572.

Figure 6D:
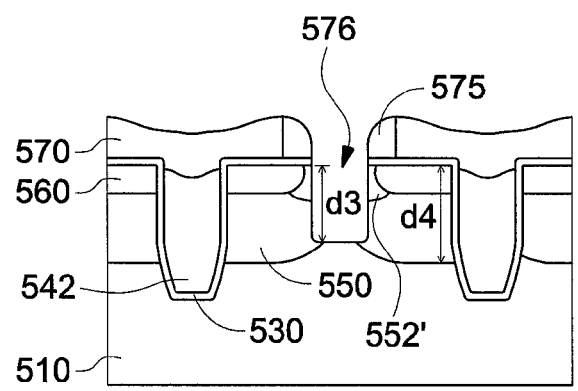

Next, as shown in FIG. 6D, spacers 575 are formed on the both sides of the open 572 to define a narrow trench 576 at the bottom of the open 572. Then, an etching process is carried out by using the spacer as an etching mask to form the narrow trench 576, which is extended from the bottom of the open 572 and penetrates the heavily doped region 552 and the body 550. In addition, at least a portion of the bottom of the narrow trench 576 is located in the silicon substrate 510 below the body 550, which is regarded as the drain region. That is, the narrow trench 576 can be regarded as a lower portion of the open 572, which extends downward to the silicon substrate 510 below the body 550.

Because the depth profile of the body 550 is declined from the sidewall of the gate trench 520 toward the first polysilicon structure 544, the depth d3 of the narrow trench 576, which is located at the bottom of the open 572 and is utilized to expose the silicon substrate 510 below the body 550, can be smaller than the greatest depth d4 of the body 550.

As shown in FIG. 6D, the spacer 575 is utilized to adjust the width of the narrow trench 576 to make source that at least a portion of the heavily doped region 552' is remained on both sides of the narrow trench 576. In addition, the narrow trench 576 in the present embodiment is away from the source region 560 and the source region 560 is electrically connected to the metal layer 590 through the bottom of the open 572. However, the present invention is not so restricted. With the width of the narrow trench 576 being adequately increased by adjusting the thickness of the spacer 575, the source region 560 can be electrically connected to the metal layer 590 through both the bottom of the open 572 and the sidewall of the narrow trench 576, which is helpful for reducing contact resistance.

Figure 6E:
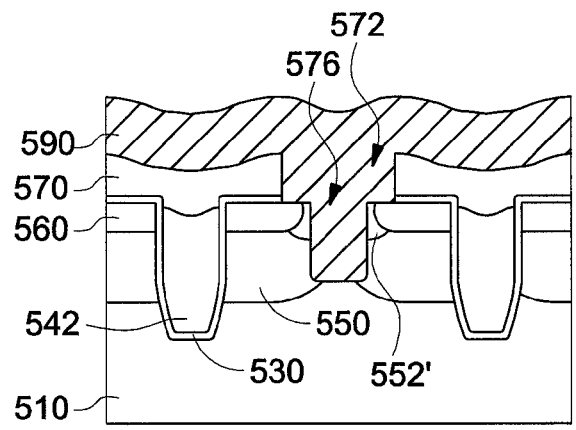

Finally, as shown in FIG. 6E, a metal layer 590 is deposited over all the exposed surfaces and fills the narrow trench 576 and the open 572. The metal layer 590 is electrically connected to the body 550 through the heavily doped region 552' and a schottky diode is formed at the bottom of the narrow trench 576.

Figure 7:
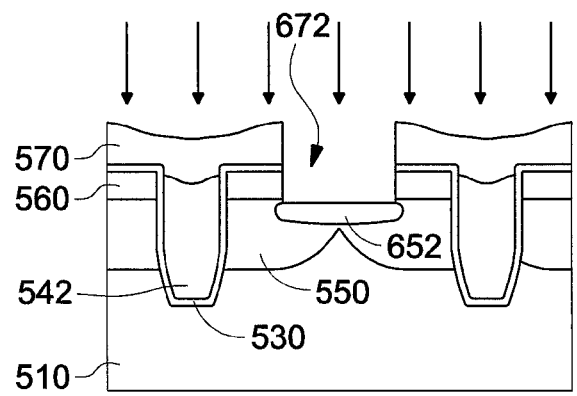
FIG. 7 is a schematic view showing a fabrication of the power semiconductor structure with schottky diode in accordance with a sixth embodiment of the present invention.

FIG. 7 is a schematic view showing a fabrication method of a power semiconductor structure with schottky diode in accordance with a sixth embodiment of the present invention. FIG. 7 shows the fabrication process following the step of FIG. 6B. As shown, a major difference between the present embodiment and the fifth embodiment lies in the formation of the open 672. As shown in FIG. 7, after the first polysilicon structure 544 is removed, the remained dielectric structure 570 is utilized as an etching mask to form the open 672 with a bottom substantially located below the source doped region 560. The source region 560 is adjacent to the sidewall of the open 672. Thereafter, a heavily doped region 652 is formed at the bottom of the open 672 by implanting dopants of first conductive type to the open 672. The following process of the fabrication method in accordance with the present embodiment is similar to that of the fifth embodiment, which is not repeated here.

Figure 8:
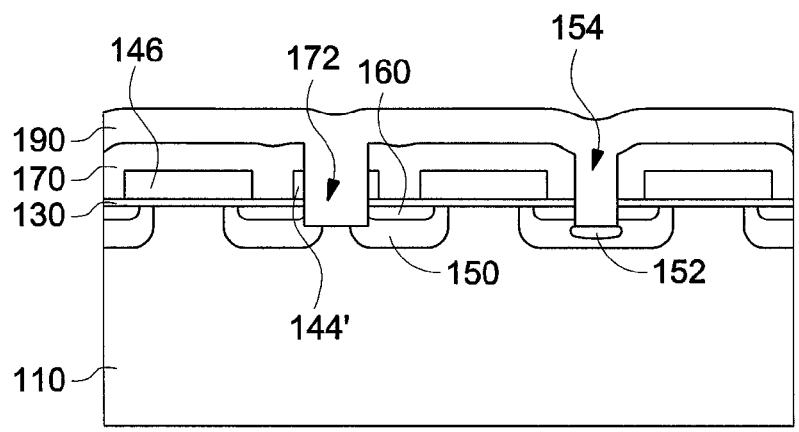
FIG. 8 is a schematic view showing a fabrication of the power semiconductor structure with schottky diode in accordance with a seventh embodiment of the present invention.

In the above mentioned embodiments, the trenched power semiconductor structures are used to demonstrate the idea of the present invention. However, the present invention is not so restricted. FIG. 8 is a schematic view showing a fabrication method of the planar power semiconductor structure with schottky diode in accordance with a seventh embodiment of the present invention. In this embodiment, the fabrication process of the first embodiment is applied to the fabrication process of the planar power semiconductor structure. As shown, the major difference between the present embodiment and the first embodiment is the location of the polysilicon gate structure. The polysilicon gate structure 146 of the present embodiment is formed on the upper surface of the silicon substrate 110 by using lithographic and etching processes. As to the other portion of the power semiconductor structure, the present embodiment is substantially identical to that of the first embodiment. Similarly, the other embodiments mentioned above can be applied to the planar power semiconductor structure without question.

Figure 9A:
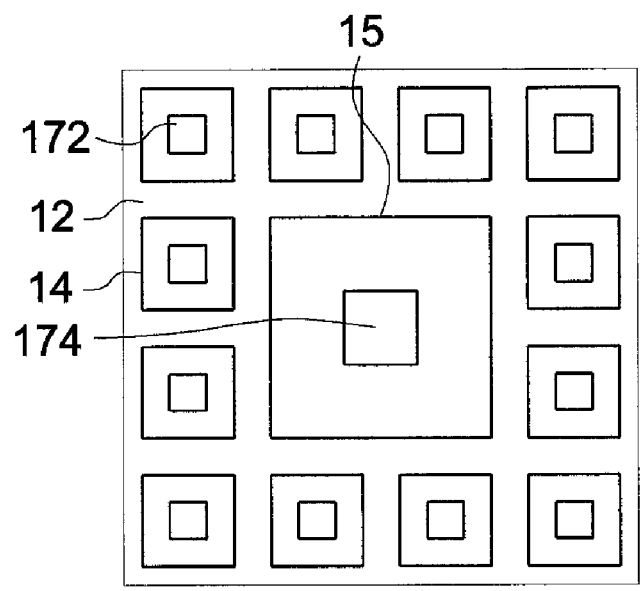
FIGS. 9A to 9B are schematic views showing two different arrangements of the cells of the power semiconductor structure with schottky diode in accordance with the present invention.
Figure 9B:
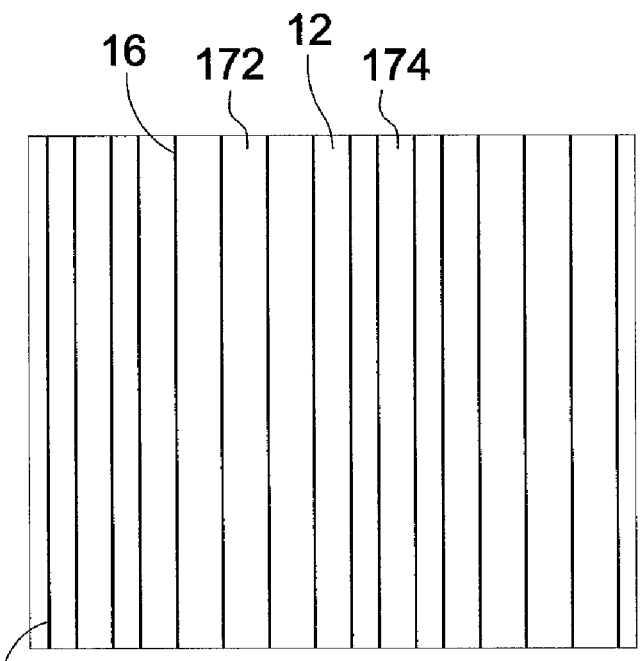

FIGS. 9A and 9B are top views showing two different arrangements of cells in the power semiconductor structure with schottky diode in accordance with the present invention. The power semiconductor structure in FIG. 9A shows the closed-cell arrangement and the power semiconductor structure in FIG. 9B shows the striped-cell arrangement. In FIG. 9A, the gates 12 of the power semiconductor structure are arranged in matrix to define a plurality of small square regions 14 and a plurality of big square regions 15 surrounded by the small square regions 14. The side length of the big square region 15 is a multiple of that of the short square region 14. The power semiconductor structure shown in the right side of FIG. 2E is located in the small square regions 14, and the power semiconductor structure with schottky diode shown in the left side of FIG. 2E is located in the big square regions 15. In FIG. 9B, the gates 12 of the power semiconductor structure are rectangular in shape to define a plurality of rectangular regions 16 and 17 with different width. Wherein, the power semiconductor structure shown in the right side of FIG. 2E is located in the rectangular regions 17 with smaller width, and the power semiconductor structure with schottky diode shown in the right side of FIG. 2E is located in the rectangular regions 16 with greater width.

The typical metal-oxide-semiconductor transistor processes can be easily adapted to the above mentioned fabrication method of the power semiconductor structure in accordance with the present invention. In addition, the related processes and equipments are well-established. Thus, the fabrication method provided in the present invention has the advantages of low cost and high feasibility.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a power semiconductor structure with schottky diode, comprising:
  a) forming a polysilicon layer including at least a polysilicon gate structure and a first polysilicon structure separated by a predetermined distance, on a silicon substrate, wherein the polysilicon gate structure is located in a gate trench on the silicon substrate;
  b) forming at least a body and at least a source region in the silicon substrate by implanting dopants through the first polysilicon structure, wherein the first polysilicon structure is located on an upper surface of the silicon substrate;
  c) forming a dielectric layer covering the polysilicon gate structure and the first polysilicon structure;
  d) forming an open, which is substantially aligned to the first polysilicon structure, in the dielectric layer to expose the silicon substrate below the body, and the open having a depth smaller than a greatest depth of the body; and
  e) filling a metal layer in the open.

2. The fabrication method of a power semiconductor structure with schottky diode of claim 1, wherein the step of forming the open comprising:
  removing the dielectric layer on an upper surface of the first polysilicon structure;
  removing the first polysilicon structure to form the open; and
  extending the open downward to a depth below the source region.

3. The fabrication method of a power semiconductor structure with schottky diode of claim 2, wherein the step of extending the open downward to a depth below the source region comprising:
  forming a spacer on a sidewall of the open; and
  extending the open downward by using the spacer as an etching mask.

4. The fabrication method of a power semiconductor structure with schottky diode of claim 3, before the step of forming the spacer further comprising the step of implanting dopants through the dielectric layer to form a heavily doped region at a bottom of the open.

5. The fabrication method of a power semiconductor structure with schottky diode of claim 2, after the step of extending the open downward to a depth below the source region further comprising:
  forming a spacer on a sidewall of the open; and
  extending the open downward by using the spacer as an etching mask.

6. The fabrication method of a power semiconductor structure with schottky diode of claim 1, wherein the step of forming the open to expose the silicon substrate below the body comprises:
  defining the open with a width smaller than that of the first polysilicon structure and forming the open penetrating the dielectric layer and the first polysilicon structure by etching;
  implanting dopants through the etched dielectric layer to form a heavily doped region, which is substantially located below the source region and has at least a portion located in the body region; and
  extending the open to expose the source region and the heavily doped region.

7. The fabrication method of a power semiconductor structure with schottky diode of claim 1, wherein the step of forming the open comprises:
  implanting dopants to the body with a tilted implanting angle to form at least a heavily doped region below the source region and adjacent to both a sidewall and a bottom of the open.

8. The fabrication method of a power semiconductor structure with schottky diode of claim 7, after the step of forming the heavily doped region further comprising the step of extending the open to a depth below the heavily doped region.

* * * * *